United States Patent
Lin et al.

(10) Patent No.: US 8,946,737 B2
(45) Date of Patent: Feb. 3, 2015

(54) LIGHT EMITTING DIODE AND MANUFACTURING METHOD THEREOF

(75) Inventors: Ya-Wen Lin, Hsinchu (TW); Po-Min Tu, Hsinchu (TW); Shih-Cheng Huang, Hsinchu (TW); Chia-Hung Huang, Hsinchu (TW); Shun-Kuei Yang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 114 days.

(21) Appl. No.: 13/570,214

(22) Filed: Aug. 8, 2012

(65) Prior Publication Data
US 2013/0161652 A1    Jun. 27, 2013

(30) Foreign Application Priority Data
Dec. 27, 2011  (CN) .......................... 2011 1 0443704

(51) Int. Cl.
  *H01L 33/00*    (2010.01)
(52) U.S. Cl.
  USPC  257/91; 257/98; 257/E33.069; 257/E33.073; 438/27; 438/29; 438/71; 315/368.15

(58) Field of Classification Search
  USPC ................ 257/79, 91, 98, E33.069, E33.073; 438/29, 71, 956; 315/368.15
  See application file for complete search history.

(56) References Cited

U.S. PATENT DOCUMENTS

2011/0095327 A1*  4/2011  Shinohara et al. .............. 257/98

* cited by examiner

*Primary Examiner* — Su Kim
(74) *Attorney, Agent, or Firm* — Novak Druce Connolly Bove + Quigg LLP

(57) ABSTRACT

A light emitting diode (LED) includes a substrate, a buffer layer and an epitaxial structure. The substrate has a first surface with a patterning structure formed thereon. The patterning structure includes a plurality of projections. The buffer layer is arranged on the first surface of the substrate. The epitaxial structure is arranged on the buffer layer. The epitaxial structure includes a first semiconductor layer, an active layer and a second semiconductor layer arranged on the buffer layer in sequence. The first semiconductor layer has a second surface attached to the active layer. A distance between a peak of each the projections and the second surface of the first semiconductor layer is ranged from 0.5 μm to 2.5 μm.

2 Claims, 7 Drawing Sheets

LIGHT EMITTING DIODE AND MANUFACTURING METHOD THEREOF

BACKGROUND

1. Technical Field

The present disclosure generally relates to solid state light emitting devices and, more particularly, to a light emitting diode (LED) with high light extraction efficiency and a manufacturing method thereof.

2. Description of the Related Art

LEDs have many advantages, such as high luminosity, low operational voltage, low power consumption, compatibility with integrated circuits, easy driving, long term reliability, and environmental friendliness, which have promoted the wide use of LEDs as a light source.

Generally, an LED includes a substrate, an N-type semiconductor layer, an active layer and a P-type semiconductor layer arranged on the substrate in sequence. Part of light emitted from the active layer transmits to the substrate and is absorbed by the substrate; therefore, the light extraction efficiency of the LED is not as high as desired.

Therefore, what is needed is an LED and a manufacturing method thereof which can overcome the described limitations.

DETAILED DESCRIPTION OF EMBODIMENTS

Figure 1:
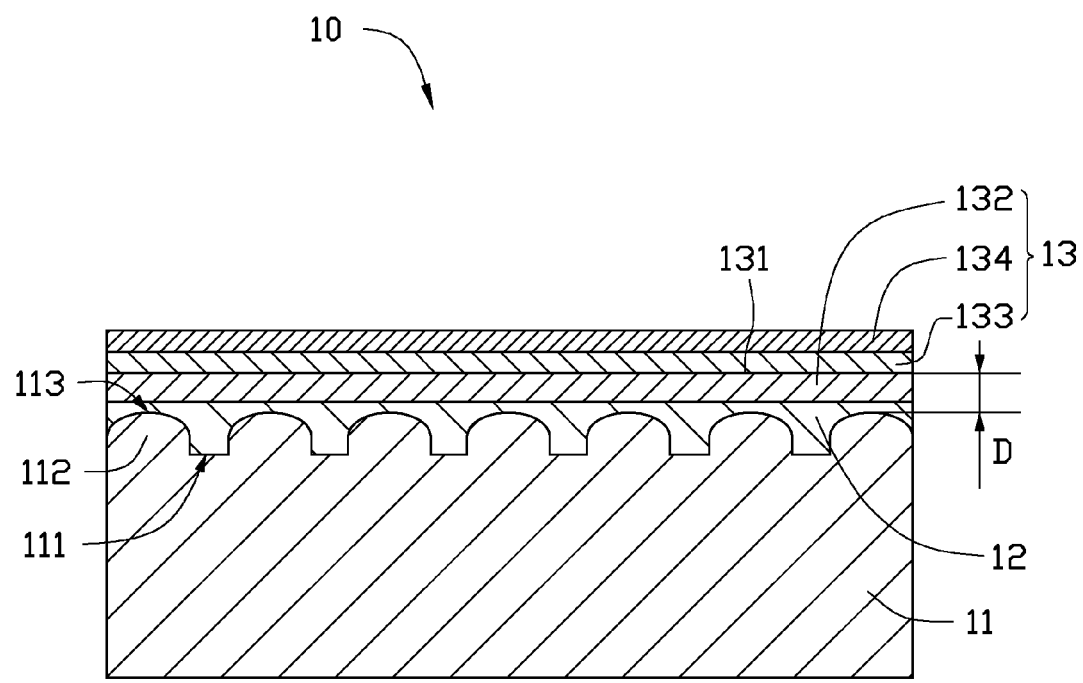
FIG. 1 is a cross-sectional view of an LED, according to an exemplary embodiment of the present disclosure.

Referring to FIG. 1, an LED 10, in accordance with an embodiment, is provided. The LED 10 includes a substrate 11, a buffer layer 12 arranged on the substrate 11, and an epitaxial structure 13 arranged on the buffer layer 12.

The substrate 11 preferably is a monocrystal plate and made of sapphire. The substrate 11 includes a first surface 111 having a patterning structure. In the present embodiment, the patterning structure includes a plurality of projections 112 evenly formed on the first surface 111. A distance between each two adjacent projections 112 is 2 μm. Each projection 112 has a convex arc surface 113, and a diameter of the arc surface 113 is 3 μm. In the present embodiment, each of the convex arc surfaces 113 has a peak, and the peaks of the convex arc surfaces 113 are coplanar.

The buffer layer 12 is formed on the first surface 111 of the substrate 11 and covers the patterning structure.

The epitaxial structure 13 is grown on the buffer layer 12 by epitaxy. The buffer layer 12 is used to reduce the lattice mismatch between the substrate 11 and the epitaxial structure 13. The epitaxial structure 13 includes a first semiconductor layer 132, an active layer 133 and a second semiconductor layer 134 arranged on the buffer layer 12 in sequence. The first semiconductor layer 132 includes a second surface 131 attached to the active layer 133. In the present embodiment, a distance D between the peaks of the convex arc surfaces 113 and the second surface 131 of the first semiconductor layer 132 ranges from 0.5 to 2.5 μm. In the present embodiment, the first semiconductor layer 132 is an N-type nitride layer, and the second semiconductor layer 134 is a P-type nitride layer.

Figure 2:
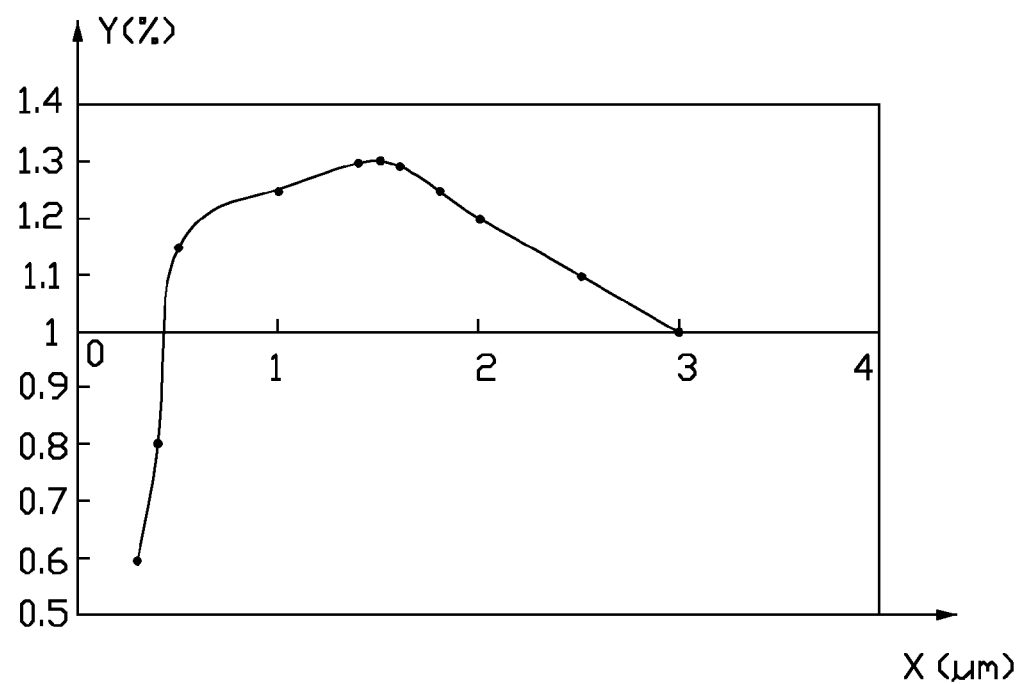
FIG. 2 is a graph of light extraction efficiency of the LED vs. a distance D defined in the LED of FIG. 1.

Referring to FIG. 2, a graph of light extraction efficiency of the LED 10 is provided. X-axis represents the distance D between the peaks of the convex arc surfaces 113 and the second surface 131 of the first semiconductor layer 132, and Y-axis represents the light extraction efficiency of the light emitting diode 10. The light extraction efficiency is defined as 1 when the distance D between the peaks of the convex arc surfaces 113 and the second surface 131 of the first semiconductor layer 132 is 3 μm. It can be seen from FIG. 2, when the distance D is within the range from 0.5 to 2.5 μm, the light extraction efficiency of the LED 10 can be improved at least ten percents. When the distance D is within the range from 0.5 to 1.8 μm, the light extraction efficiency of LED 10 can be improved at least fifteen percents. When the distance D is less than 0.5 μm, the light extraction efficiency of the LED 10 is sharply reduced since the first semiconductor layer 132 is too thin, whereby current applied to the semiconductor layer 132 can not be evenly distributed.

Referring to FIGS. 3-7, a method for manufacturing the LED 10 in accordance with an exemplary embodiment is also disclosed. The method includes the following steps.

Figure 3:
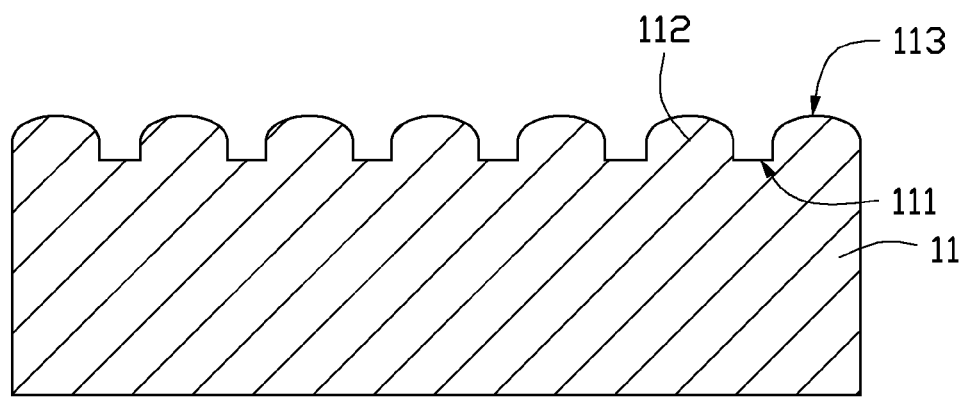
FIGS. 3-7 are cross-sectional views showing different steps of an embodiment of a method for manufacturing the LED of FIG. 1.

Step 1: referring to FIG. 3, a substrate 11 is provided wherein the substrate 11 includes a first surface 111 having a patterning structure thereon. In the present embodiment, the patterning structure includes a plurality of projections 112 evenly formed on the first surface 111, wherein a distance between each two adjacent projections 112 is 2 μm. Each projection 112 has a convex arc surface 113, and a diameter of the arc surface 113 is 3 μm. In the present embodiment, each of the convex arc surfaces 113 has a peak, and the peaks of the convex arc surfaces 113 are coplanar.

Figure 4:
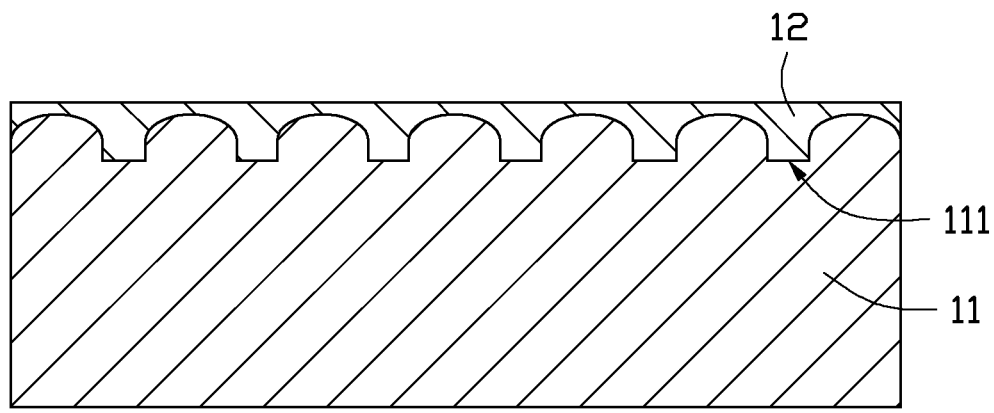

Step 2: referring to FIG. 4, a buffer layer 12 is formed on the first surface 111 of the substrate 11. The buffer layer 12 covers the patterning structure.

Figure 5:
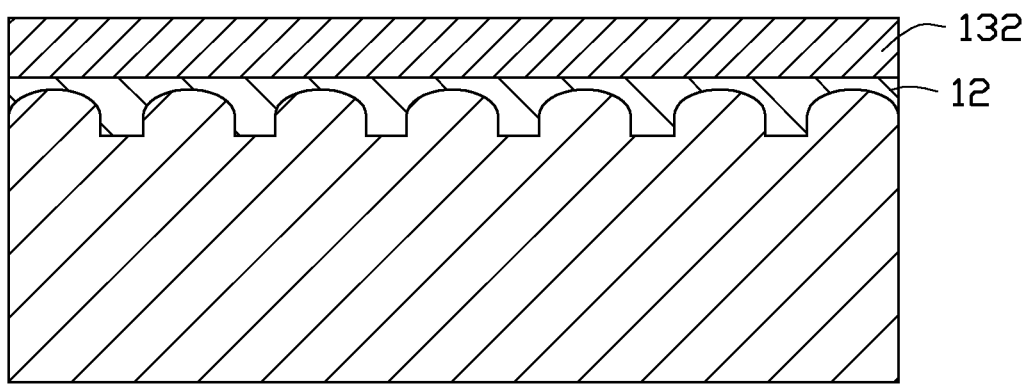

Step 3: referring to FIG. 5, a first semiconductor layer 132 is formed on the buffer layer 12. In the present embodiment, the first semiconductor layer 132 grows on the buffer layer 12 by epitaxy, and a thickness of the first semiconductor layer 132 is 3 μm. In the present embodiment, the first semiconductor layer 132 is an N-type nitride layer.

Figure 6:
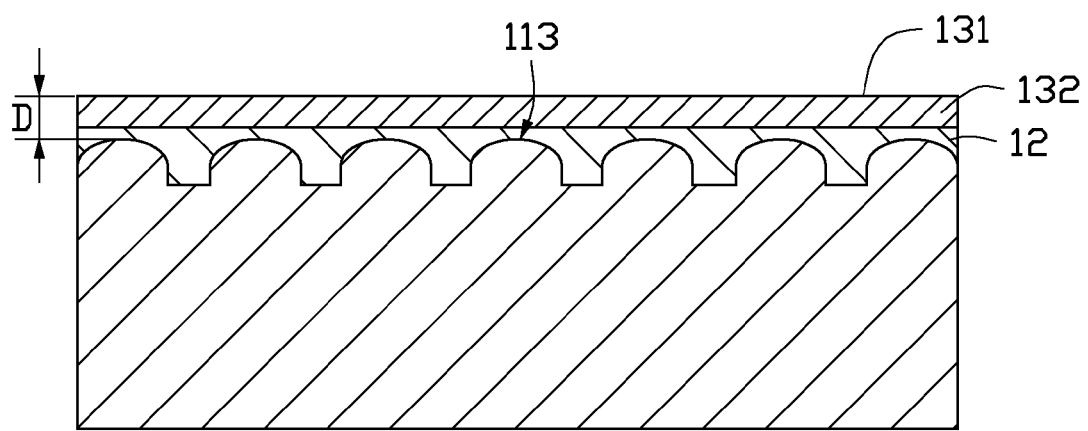

Step 4: referring to FIG. 6, etching the first semiconductor layer 132 until a distance D between a second surface 131 of the first semiconductor layer 132 away from the buffer layer 12 and the peaks of the convex arc surfaces 113 is in a range from 0.5 to 2.5 μm. In other embodiments, in step 3, it can be proceeded that a first semiconductor layer 132 on the buffer layer 12 directly has such a thickness that the distance D between the peaks of the convex arc surfaces 113 and the second surface 131 of the first semiconductor layer 132 is ranged from 0.5 to 2.5 μm; therefore, the step 4 is not need.

Figure 7:
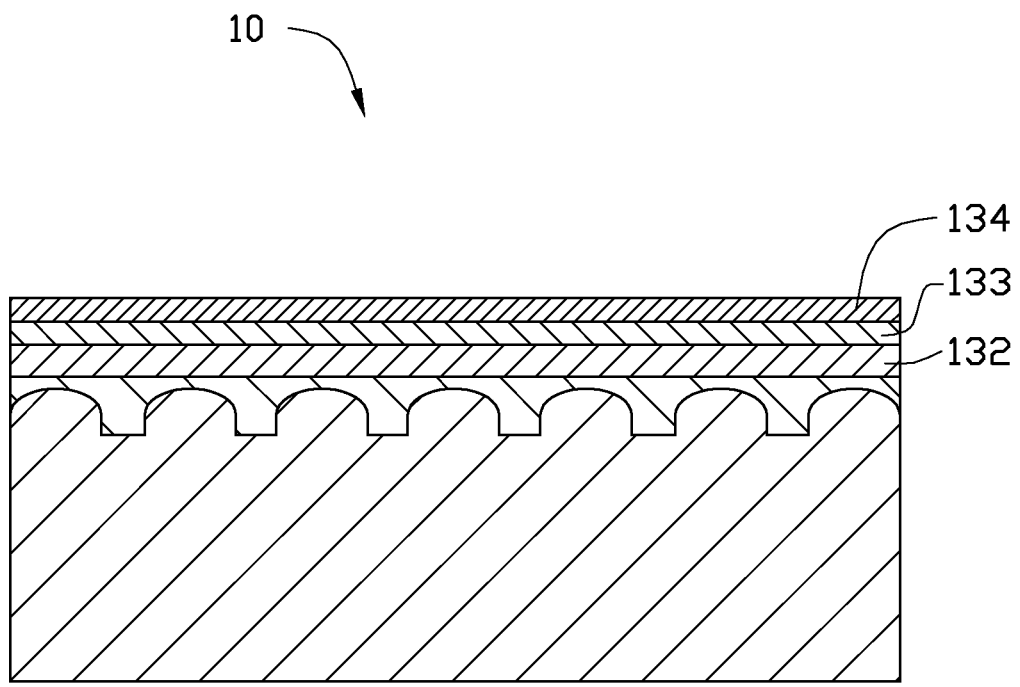

Step 5: referring to FIG. 7, an active layer 133 and a second semiconductor layer 134 are formed on the second surface 131 of the first semiconductor layer 132 in sequence. Thus, the LED 10 is obtained. In the present embodiment, the second semiconductor layer 134 is a P-type nitride layer. The active layer 133 is a multiple quantum well (MQW) layer.

The distance D between the peaks of the convex arc surfaces 113 and the second surface 131 of the first semiconductor layer 132 ranges from 0.5 to 2.5 μm, light emitted from the LED 10 can be reflected by the first surface 111 of the substrate 11 more effectively; therefore, the light extraction efficiency of the LED 10 can be improved.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A light emitting diode (LED) comprising:
a substrate having a first surface with a patterning structure formed on the first surface, the patterning structure comprising a plurality of projections;
a buffer layer arranged on the first surface of the substrate; and
an epitaxial structure arranged on the buffer layer, the epitaxial structure comprising a first semiconductor layer, an active layer and a second semiconductor layer arranged on the buffer layer in sequence, the first semiconductor layer having a second surface attached to the active layer;
wherein the first semiconductor layer is an N-type nitride layer and a distance between a peak of each of the projections and the second surface of the first semiconductor layer is in a range from 0.5 to 2.5 μm, each projection comprises a convex arc surface on which the peak is formed, a diameter of the arc surface is 3 μm.

2. A method for manufacturing the LED, comprising:
Step 1: providing a substrate, the substrate comprising a first surface having a patterning structure, the patterning structure comprising a plurality of projections, each projection comprises a convex arc surface on which the peak is formed, a diameter of the arc surface is 3 μm;
Step 2: forming a buffer layer on the first surface of the substrate;
Step 3: forming a first semiconductor layer on the buffer layer, the first semiconductor layer having a second surface away from the buffer layer, the first semiconductor layer is an N-type nitride layer and a peak of each of the projections and the second surface of the first semiconductor layer being ranged from 0.5 to 2.5 μm; and
Step 4: forming an active layer and a second semiconductor layer on the second surface of the first semiconductor layer in sequence.

* * * * *